United States Patent
Misra

[19]

[11] Patent Number: 6,165,612
[45] Date of Patent: Dec. 26, 2000

[54] THERMALLY CONDUCTIVE INTERFACE LAYERS

[75] Inventor: Sanjay Misra, Shoreview, Minn.

[73] Assignee: The Bergquist Company, Edina, Minn.

[21] Appl. No.: 09/312,414

[22] Filed: May 14, 1999

[51] Int. Cl.[7] .................................................. B32B 15/04
[52] U.S. Cl. ...................... 428/344; 428/320.2; 428/322; 174/118; 156/60; 156/272.2; 257/675; 257/687; 257/701; 257/702; 257/706; 257/707
[58] Field of Search ................................ 257/675, 687, 257/701, 702, 706, 707; 428/344, 320.2, 322; 156/272.2, 60

[56] References Cited

U.S. PATENT DOCUMENTS

| | | | |
|---|---|---|---|
| 4,032,490 | 6/1977 | Murata | 260/23.3 |
| 4,323,914 | 4/1982 | Berndlmaier . | |
| 4,363,930 | 12/1982 | Hoffman | 174/255 |
| 4,568,713 | 2/1986 | Hanson | 524/291 |
| 4,761,450 | 8/1988 | Lakshmanan | 524/488 |
| 4,824,889 | 4/1989 | Mostert | 524/232 |
| 4,994,516 | 2/1991 | Luvinh | 524/275 |
| 5,026,752 | 6/1991 | Wakabayashi | 524/271 |
| 5,091,454 | 2/1992 | Arenat | 524/293 |
| 5,098,609 | 3/1992 | Iruvanti | 252/511 |
| 5,150,197 | 9/1992 | Hamburgen | 257/706 |
| 5,213,736 | 5/1993 | Sumita et al. | 264/104 |
| 5,412,247 | 5/1995 | Martin | 257/701 |
| 5,977,629 | 11/1999 | Fogal et al. | 257/693 |

*Primary Examiner*—Cathy F. Lam
*Attorney, Agent, or Firm*—Haugen Law Firm PLLP

[57] ABSTRACT

An improved interface pad or layer for use in combination with solid state electronic components adapted to be interposed along a heat dissipating path between the electronic device and a mounting chassis or heat-sink surface. The interface pads comprise a polyphenylsulfone binder or matrix blended with a particulate solid such as alumina, boron nitride, graphite, silicon carbide, diamond, metal powders, and mixtures or blends thereof. Advantageous formulations include up to 45% alumina. Another advantageous formulation includes between 10% and 20% by weight of boron nitride, balance polyphenylsulfone.

11 Claims, 1 Drawing Sheet

THERMALLY CONDUCTIVE INTERFACE LAYERS

BACKGROUND OF THE INVENTION

The present invention relates generally to an improved interface pad or layer for thermal management when used in combination with solid state electronic components or other types of heat generating electronic devices, and more particularly to an interface layer or pad which is adapted to be interposed along a heat dissipating path between a solid state electronic device and a mounting chassis or heat-sink surface. The interfaces of the present invention comprise a polyphenylsulfone (PPSU) layer, preferably but not necessarily loaded with a particulate solid, which is coated with conformal coatings (which are preferably loaded with thermally conductive fillers), on one or both sides in any combination. The polyphenylsulfone layer serves as a dielectric in those applications requiring heat transfer from a heat-generating semiconductor device or circuit to a normally highly conductive heat spreader, chassis, sink, or the like. When compounded or blended with thermally conductive fillers such as alumina, boron nitride, aluminum nitride, silicon carbide, silicon nitride, diamond, silver, copper, or the like, the thermal properties of the dielectric composite are enhanced over those already available from the polysulfone resin. In other words, the particulate solid or filler functions as an enhancer of thermal conductivity for the polyphenylsulfone resin matrix. The polyphenylsulfone in the formulations of the present invention has a glass transition temperature ranging from between about 200° C. and 230° C., and preferably a glass transition temperature of about 220° C. The glass transition temperature of individual polymers is relatively narrow, thereby contributing to consistency and reliability of performance for layers or pads prepared from these formulations The high glass transition of these polymers allows them to retain good mechanical and electrical properties over a large temperature range, thereby rendering products made pursuant to the present invention ideal candidates for applications requiring heat conducting electrically insulative interfaces.

The polyphenylsulfone of the interface layers or pads is advantageous due to the excellent thermal properties and high temperature performance characteristics with low water absorption properties as well. The high temperature properties permit utilization of the layers under continuous high temperature conditions. Additionally, the polyphenylsulfone resin is highly ductile and hence less prone to cracking or embrittlement. Polyphenylsulfones possess high chemical and solvent resistance and facilitate rapid and convenient production operations in the molten or melt stage. The interfaces prepared in accordance with the present invention are durable and exhibit a high cohesive strength. At the same time, the material possesses good cut-through properties, thereby enabling a wide variety of production techniques to be used in shaping and/or configuring into products.

The interfaces of the present invention may be secured or attached either directly onto the surface of the solid state electronic device or directly mounted to the surface upon which the device is being operatively coupled. These interfaces may be secured as required onto surfaces of substrates of metallic, ceramic, or polymeric materials. Typically, the polyphenylsulfone materials of the present invention will be coated on one or both sides with conformable elastomeric films or coatings based on silicone, polyurethane or other elastomeric polymers. Other coatings may include pressure sensitive adhesives such as silicone, acrylic, thermoplastic elastomer types, and the like. Heat activated "dry" adhesives such as polyimide(amide), polyurethane, epoxy adhesives and the like may be utilized as well. Phase-change and/or hot-melt coatings which are typically dry at room temperature but flow at device utilization temperatures may also be satisfactorily employed. Additionally, the conformable elastomeric coatings may be filled with thermally conductive fillers such as alumina, boron nitride, aluminum nitride, silicon carbide, silicon nitride, diamond, silver, copper, and the like. These coated layers or films of polyphenylsulfone are then interposed between a heat generating solid state device or circuit, and a heat sink/spreader/chassis. These layers also find application as a dielectric member in etched copper circuit configurations where they would be interposed between the copper circuitry and a heat spreading substrate, typically fabricated from aluminum.

The significant advantage of utilizing polyphenylsulfone polymer is that it is naturally thermally conductive. Films (1, 5 and 10 mil) made from polyphenylsulfone, available from Amoco (Chicago, Ill.) as R-5100 grade, were tested in accordance with ASTM-D5470 method. These films exhibited a thermal conductivity of 0.25 W-m$^{-1}$K$^{-1}$ which is twice the thermal conductivity of commonly employed engineering thermoplastics. Examples of the commonly employed engineering plastics are polyimide (PI from E.I. DuPont deNemours Corp. of Wilmington, Del.), polyester (PET, PEN from DuPont), polyphenylenesulfide (PPS from Toray Engineering, Ltd. of Tokyo, Japan or Philips Petroleum of Bartlesville, Okla.), and polyetherimide (PEI from GE Plastics of Pittsfield, Mass.). In the table below we list some salient properties of these engineering plastics, to illustrate that PPSU has excellent engineering properties in addition to its high thermal conductivity.

TABLE I

| Property | PI Kapton | PPS Torelina | PEI Ultem | PEN Kaladex | PPSU |
|---|---|---|---|---|---|
| Thermal Conductivity (W/mK) | 0.11 | 0.13 | 0.12 | 0.15 | 0.25 |
| Tensile Strength (psi) | 33500 | 39000 | 14200 | 32000 | 10100 |
| Tensile Modulus (psi) | 370000 | 570000 | 475000 | 870000 | 340000 |
| Glass Transition (° C.) | >350 | 90 | 215 | 120 | 220 |
| Water Absorption (%) | 2.2 | 0.05 | 0.25 | 0.4 | 0.37 |

TABLE I-continued

| Property | PI Kapton | PPS Torelina | PEI Ultem | PEN Kaladex | PPSU |
|---|---|---|---|---|---|
| Electrical Resistivity (ohm-cm) | $10^{18}$ | $5 \times 10^{17}$ | $10^{17}$ | $10^{18}$ | $>10^{15}$ |
| Electrical Continuous Use Temperature (° C.) | 220 | 180 | 170 | 180 | 180 |

With the addition of carefully chosen amounts of thermally conductive fillers like alumina, aluminum nitride, boron nitride, silicon carbide, etc., it is possible to increase the thermal conductivity of the polyphenylsulfone matrix even further while maintaining satisfactory mechanical and electrical properties.

The features of the present invention provide a highly thermally conductive interface which is attached to surfaces along a thermal path, with the improved interface being a highly thermally conductive dielectric having a consistent and uniform thickness free of air and/or voids. This combination of features contributes to and results in consistency of performance. Given this capability in the thermally conductive interface or pad, greater predictability of performance is available from semiconductor devices utilized in combination with the pad. These advantages are obtained without experiencing the problems inherent in applications of silicone grease.

A common technique used in the past has been to prepare and fabricate a thermally conductive, electrically insulative pad of a polyimide(amide) such as Kapton or the like. Polyimide(amide) films are commercially available under the trade designation "KAPTON" from E.I. DuPont deNemours Corp. of Wilmington, Del. Particulate-filled Kapton materials have been utilized in the past, and have proven to perform satisfactorily. While these filled polyimide(amide) layers or pads perform reasonably well, they have a relatively high moisture absorption which tends to reduce the dielectric properties. In addition the Polyimide(amide) films tend to be expensive. The pads prepared in accordance with the present invention and employing polyphenylsulfone, particularly particulate-filled polyphenylsulfone are unique and exhibit unexpectedly good thermal performance characteristics. As indicated, the combination of mechanical, electrical, and thermal properties permits continuous utilization of the interfaces or pads at high operating temperatures.

SUMMARY OF THE INVENTION

In accordance with the present invention, therefore, an interface, preferably based on a filled polyphenylsulfone dielectric for mounting solid state electronic devices is provided in the form of an interface or pad and functioning to enhance thermal transfer from the device or its heat-sink or heat spreader to a chassis or other heat dissipating device. The improved interface provides advantages over the conventional normally employed pads or films. For example, when employed in an actual circuit arrangement, assembly time not only remains at or below its prior level, but the assembly operation is clean, and with ease of application and assembly being provided. Furthermore, improvements in reliability and stability of high temperature performance and operation under extreme conditions are achieved.

In addition to being highly thermally conductive, the interfaces of the present invention continue to provide a polymeric structure adapted for exposure to normal forces and pressures, due to the high glass transition temperature. Interfaces of the present invention may be employed wherever typical solid state electronic mounting packages are utilized. Because of their properties which include high solvent resistance and low water absorption, the interfaces remain highly useful and effective when the nature of the application creates exposure of the operational package to harsh or adverse environments, such as exposure to water, solvents, and high continuous operating temperatures. Some conventionally used materials or products typically tolerate only low or modest exposure to water and/or solvents, with the interfaces of the present invention thus enjoying significant advantages over such materials. The polyphenylsulfone in the interfaces of the present invention is solid and stable at high operating temperatures including those in excess of 180° C., and at the same time is resistant to stress cracking or fracture. The formulations of the present invention possess elevated glass transition temperatures and are rugged and do not become unusually brittle.

In one preferred embodiment, a glass transition temperature of about 220° C. is desirably achieved. Due to such glass transition temperatures, the interfaces of the present invention perform well in configurations between the opposed functional surfaces with which they are in contact. In other words, these interfaces or pads provide a desired total area of contact between the opposed functional or operating surfaces. This in turn, increases the rate of heat transfer through thermal conduction from the heat generating solid state electronic device through the interface to its mating heat-sink or mounting surface.

Briefly and in one embodiment, the interface material of the present invention comprises polyphenylsulfone polymer as a matrix or binder. Such polymers are available commercially under the code designations "R-5700", "R-5100" and "R-5000" from Amoco Chemical Corp. of Chicago, Ill. The specific gravity of these polymers ranges from between 1.25 and 1.3, with the conventional commercially available materials having a specific gravity of 1.29. These commercially available products normally have a refractive index of 1.6724. As indicated, the water absorption is exceptionally low, ranging down to less than 0.4%, or typically as low as 0.37%. In such an embodiment, the polyphenylsulfone is blended with a thermally conductive, electrically insulative solid particulate for enhancement of the thermal properties, while retaining mechanical properties for interface or pad formation utilizing conventional production techniques.

Polyphenylsulfone is solid at normal ambient conditions, and remains so when blended with particulate solids in the ranges set forth. The resultant formulation and products formed thereby are conveniently available as dry cohesive films, coatings, or pads. Polyphenylsulfone compositions with glass transition points ranging from between about 200° C. and 230° C. are useful, and those with points of about 220° C. are preferred for many applications. The polymer is treated for removal of impurities or unreacted components so as to yield a substantially purified product with consistent properties. The solid particulate is preferably highly thermally conductive, and is generally selected from the group consisting of alumina, boron nitride, graphite, silicon carbide, diamond, metal powders as well as mixtures or blends thereof.

The interfaces of the present invention contain sufficient polymer so as to provide appropriate cohesive strength. When alumina is employed as the particulate, the polymer blends may contain up to about 45% by weight of alumina, balance polyphenylsulfone. For boron nitride particulate, the blends may contain up to about 20% by weight of boron nitride particulate, balance polyphenylsulfone. The size range for the particulate employed in the blend is generally up to about 10 microns, with average sizes ranging from between about 6 to 8 microns. Interfaces will typically have a thickness between about 0.5 mil and 5 mils, and may in certain applications have thicknesses ranging up to about 10 mils. Interfaces or pads with a thickness of greater than about 0.5 mil are generally useful.

A preferred formulation range for alumina particulate is between about 20% and 45% by weight alumina, balance polyphenylsulfone. Blends containing between 30% and 40% of alumina particulate have been found to have wide application. When boron nitride is employed as the particulate, a preferred formulation 20 range is between about 10% and 18% boron nitride, balance polyphenylsulfone. Various blends of these particulates and others may, of course, be suitably employed.

As a further feature of the present invention, a thin coating or film typically 2–3 mils be applied to one or both of the outer surfaces of the interface material. These coatings may be conformal coatings like silicone, rubber or polyurethane, pressure sensitive adhesive coatings (acrylic or thermoplastic elastomer), heat activated dry adhesive coatings (epoxy, polyurethane, polyimide), hot melt or phase change coatings. These coatings themselves are preferably loaded with thermally conductive fillers to enhance the thermal conductivity of the composite.

Therefore, it is a primary object of the present invention to provide an improved thermal management device in the form of a thermally conductive interface pad to function as a dielectric along the heat dissipating path between a solid state electronic device and a mounting surface, and with the pad having a proper balance of thermally conductive, electrical insulative, and good mechanical properties.

It is a further object of the present invention to provide an improved interface pad material arranged to be mounted between a solid state electronic device and a chassis or heat-sink, and wherein the interface material comprises a polyphenylsulfone polymer preferably blended with a particulate solid.

It is yet a further object of the present invention to provide an improved dielectric interface pad for interposition along and within the heat dissipating path between a solid state electronic device and a mounting surface, and wherein the interface comprises a blend of polyphenylsulfone and a particulate solid, and wherein the polyphenylsulfone polymer has a glass transition temperature ranging from between about 2000C. and 230° C., preferably at about 220° C.

Other and further objects of the present invention will become apparent to those skilled in the art upon a study of the following specification, appended claims, and accompanying drawings.

IN THE DRAWINGS

FIG. 1 is an exploded schematic view of a typical assembly in which the mounting pad of the present invention is used, with the interface pad being applied to the surface of a packaged solid state electronic device to facilitate the formation of a thermally conductive path from the package to a metallic heat dissipating member or heat sink; and FIG. 2 is a vertical sectional view of the interface pad as shown in FIG. 1, with the pad being formed as a laminated component comprised of up to four layers, including the polyphenylsulfone film, two sided conformal coatings and an optional thin layer of a pressure sensitive adhesive.

DESCRIPTION OF THE PREFERRED EMBODIMENT

Figure 1:
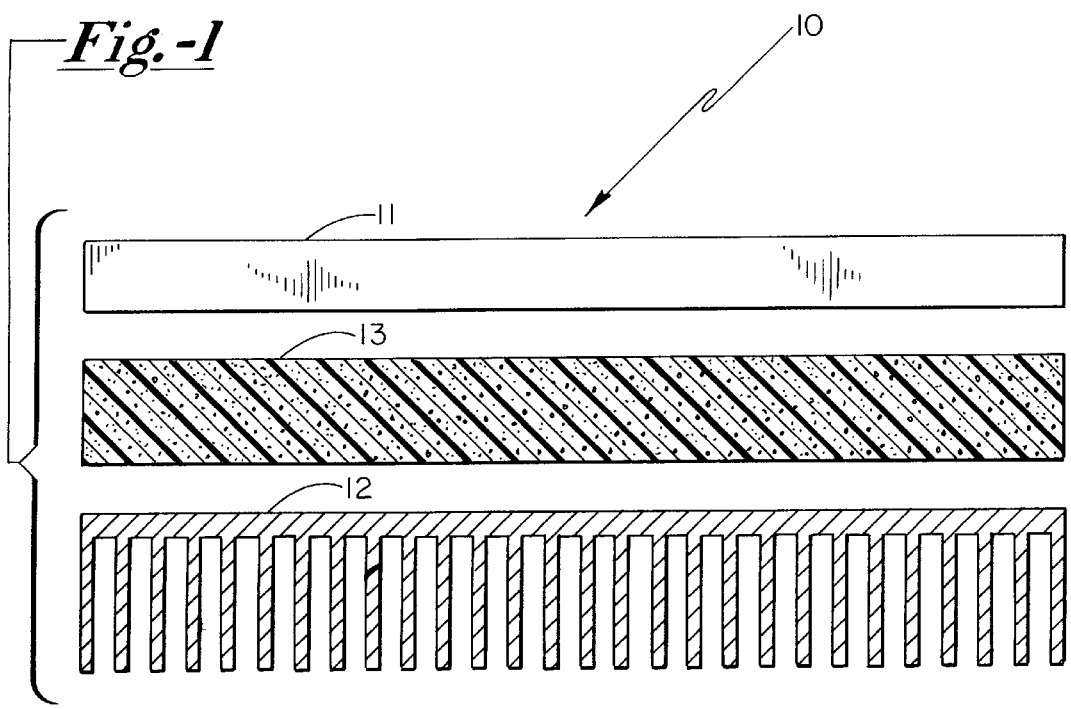

In order to facilitate the explanation of the concepts of the present invention, the specific examples are listed in the table below. The table lists the compositions of various films (1–15 mils thick) made by blending Polyphenylsulfone resin (R-5100 grade from Amoco, Chicago, Ill.) with alumina particles (diameter less than 12 microns; average 4 microns) and boron nitride particles(diameter less than 16 microns; average 7.5 microns). The composition is given in weight percent of each component. Also listed are the respective thermal conductivities and the mechanical properties of each composition.

TABLE II

| Example | PPSU | Alumina | Boron Nitride | k (W/mK) | Tensile Strength (psi) | Tensile Modulus (psi) | Notch Strength (ft-lb/in) |
|---|---|---|---|---|---|---|---|
| 1 | 100 | 0 | 0 | 0.25 | 10100 | 340000 | 13 |
| 2 | 60 | 40 | 0 | 0.4 | 11500 | 550000 | 4 |
| 3 | 70 | 30 | 0 | 0.3 | 11000 | 550000 | 5 |
| 4 | 70 | 20 | 10 | 0.4 | 11500 | 600000 | 4 |
| 5 | 80 | 0 | 20 | 0.35 | 11400 | 750000 | 1.4 |
| 6 | 70 | 0 | 30 | 0.4 | 9700 | 1200000 | 1.2 |

The formulations are blended and extruded in the melt stage into a film which is void-free and exhibits good cohesive strength and good mechanical properties. The possess excellent thermal conductivity of 0.3–0.4 W-m$^{-1}$-K$^{-1}$ as measured using ASTM-D5470 method. The tensile strength showed up to 10% improvement over that of unfilled polyphenylsulfone films. The tensile modulus showed up to 200% improvement over the unfilled film. The notched strength, for some formulations, dropped to a fifth that of the unfilled film but well within acceptable range. The electrical insulative properties did not change significantly.

Pads were made using two sided coatings of silicone (Hardness Shore A 80, k=2 W/mK) as well as phase change coatings ($T_m$=55° C., k=1.7 W/mK, viscosity of 500000 cp) on a 2 mil thick polyphenylsulfone film of example 2 from Table III above. The coatings applied were 2 mil thick on each side. The polyphenylsulfone film was also coated with a thin layer of Dow Corning 340 thermal grease (Dow Corning, Inc. Midland, Mich. The thermal resistance of these pads was measured using ASTM D5470 method.

Control samples were made with 2 mil Polyethylenenapthalate film, an engineering plastic film available from DuPont under the trade name of Kaladex-2000, which has the best thermal conductivity of commercially available engineering films.

TABLE III

| Pad Construction | Thermal Resistance (° C.-in²/W) | | |
|---|---|---|---|
| | Table II (Ex. 1) | Table II (Ex. 2) | PEN Kaladex-2000 |
| Grease-Film-Grease | 0.31 | 0.20 | 0.5 |
| Silicone-Film-Silicone | 0.45 | 0.35 | 0.65 |
| Phase Change-Film-Phase Change | 0.32 | 0.22 | 0.52 |

The thermal resistance of 2 mil unfilled Radel-R is about 40% lower than a 2 mil Polyethylenenapthalate film while that of a 40% alumina filled Radel-R film is 60% better.

GENERAL FEATURES

The alumina or other suitable particulate content is preferably present in the formulations in the ranges specified hereinabove. It has been discovered that when the particulate content significantly exceeds the recommended range, the ultimate product may lose its mechanical and electrical properties through embrittlement and loss of dielectric strength, respectively. On the other hand, when the particulate content falls substantially below the recommended ranges, thermal properties may have to be considered. The specific examples above will enable those skilled in the art to appropriately select the ranges desired.

PRODUCING THE PRODUCT

In addition to producing product through extrusion, blends made pursuant to the present invention may be formed into useful products through solvent casting as well. In this connection, methylene chloride, n-methyl pyrrolidone or dimethyl acetamide may be employed as a solvent to improve wetting of the filler surfaces. Special handling techniques are required for utilization of methylene chloride, as is recognized by those of conventional skill in the art.

OPERATION OF THE INVENTION

The present invention in its most useful form will be available as a single layer, or as a two or three layer composite laminate in which a conformal coating or film may be applied to one or both opposed surfaces of the interface pad. A thin pressure sensitive adhesive film (0.1–0.5 mil) may be applied to one side of the laminate as a positioning aide.

With attention now being directed to FIG. 1 of the drawings, the assembly generally designated 10 comprises a solid state electronic device 11 which is thermally coupled to heat sink 12 through a multiple-layer composite laminate 13 formed in accordance with the present invention. As will become apparent later, laminate 13 employs a central pad component to which a conformal coating or film has been applied to opposed surfaces thereof.

In its operational configuration, pad or laminate 13 is positioned in the conductive path of heat flow from electronic device 11, thereby improving heat transfer from the device to the heat sink, mounting chassis, or heat spreader 12. Furthermore, conformal coatings conform to any microscopic roughness and warpage of the opposed surfaces, thereby reducing interfacial thermal resistance while the polyphenylsulfone film provides an insulative yet better thermally conductive substrate.

Figure 2:
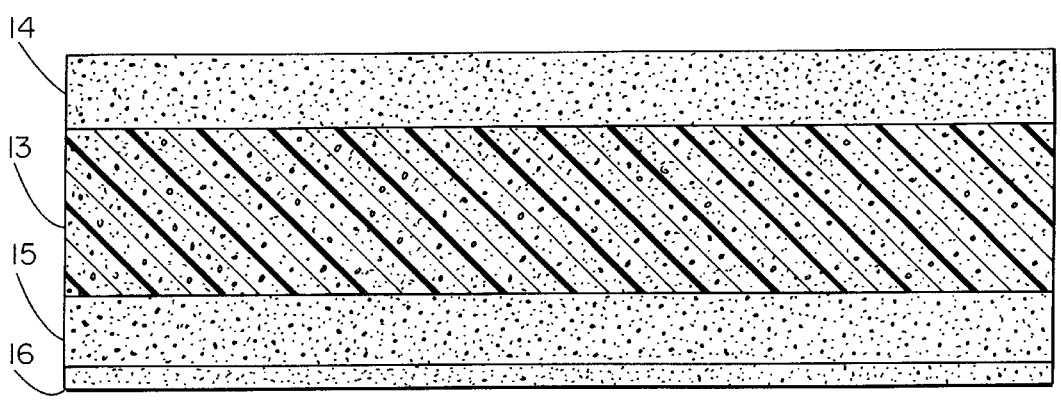

With attention now being directed to FIG. 2, the interface pad described and shown in FIG. 1 is shown in greater detail. Accordingly, interface pad 13 is comprised of a polyphenylsulfone film prepared in accordance with the description of the preferred embodiment set forth hereinabove, specifically Example 4 of Table II. Conformal coatings are applied to both sides as at 14 and 15, specifically in the form of pressure sensitive adhesive films. One such pressure sensitive adhesive layer is shown at 16, with this layer having a thickness ranging from between 0.1 and 0.5 mil.

The formulations of the present invention have long lifetimes with suitable and consistent performance. Such performance characteristics are available from these products due to the selection of materials, including the polyphenylsulfone component which provides high temperature stability along with low water and solvent absorption properties. Thus, the product may be subjected or exposed to harsh and/or adverse environments over long periods of time. The lifetimes for interfaces of the present invention may be significantly longer than those for components and formulations presently in use, such as for silicone greases, and the like. This is due to the exceptional balance of properties possessed and demonstrated by the interfaces of the present invention. By way of further example, data suggests that the materials of the present invention are durable and demonstrate a slow rate of decomposition, thereby contributing to long life.

It will be appreciated that the examples provided hereinabove are illustrative only and are not to be regarded as a limitation upon the scope of the following appended claims.

What is claimed is:

1. A relatively thin thermally conductive, electrically insulative mounting pad to be positioned between a base surface of a heat generating solid state electronic device and a mounting surface of a heat-sink; said mounting pad comprising:

(a) a film consisting essentially of polyphenylsulfone matrix impregnated with a thermally conductive, electrically insulative particulate filler selected from the group consisting of alumina, boron nitride, graphite, silicon carbide, diamond, metal powders as well as mixtures or blends thereof in an amount ranging from between about 10% and 50% by weight of polyphenylsulfone.

2. The mounting pad of claim 1 wherein said particulate has an average particle size ranging from between about 6 microns and 8 microns.

3. The mounting pad of claim 1 wherein the particulate filler is selected from the group consisting of alumina, boron nitride, and combinations thereof.

4. The mounting pad of claim 1 wherein said thermally conductive, electrically insulative mounting pad has a uniform thickness ranging from between about 0.5 mil and 10 mils.

5. The mounting pad of claim 4 being particularly characterized in that said mounting pad is bonded to the surface of a heat-sink with an adhesive film.

6. The mounting pad of claim 5 wherein the adhesive is a pressure sensitive adhesive.

7. The mounting pad of claim 5 wherein the mounting pad and adhesive film are substantially free of entrapped air.

8. The mounting pad of claim 4 wherein there is a coating of heat activated adhesive on both sides, between 0.5–3 mils on each side.

9. The mounting pad of claim 4 wherein there is a coating of a phase-change material, 0.5–3 mils thick on each side, exhibiting flow characteristics at the operating temperature of said heat generating solid state electronic device.

10. The mounting pad of claim 5 wherein there is a conformal coating between said mounting pad and said adhesive film, said conformal coating is based on silicone or polyurethane resin, 0.5–3 mils on each side of said mounting pad.

11. A relatively thin thermally conductive, electrically insulative mounting pad to be positioned between a base surface of a heat generating solid state electronic device and a mounting surface of a heat-sink; said mounting pad comprising a laminate which includes:

(a) a first film consisting of polyphenylsulfone polymer having a glass transition temperature of between about 200° C. and 230° C., having a specific gravity of about 1.3;

(b) a second film bonded to said first film and consisting essentially of polyphenylsulfone matrix impregnated with a thermally conductive, electrically insulative particulate filler selected from the group consisting of alumina, boron nitride, graphite, silicon carbide, diamond, metal powders as well as mixtures or blends thereof in an amount ranging from between about 10% and 50% by weight of polyphenylsulfone.

* * * * *